United States Patent
Stoner

(10) Patent No.: US 9,490,830 B2
(45) Date of Patent: Nov. 8, 2016

(54) METHOD AND APPARATUS FOR SYNTHESIS OF WIDEBAND LOW PHASE NOISE RADIO FREQUENCY SIGNALS

(71) Applicant: Star Dynamics Corporation, Hilliard, OH (US)

(72) Inventor: Paul Douglas Stoner, Lewis Center, OH (US)

(73) Assignee: Star Dynamics Corporation, Hilliard, OH (US)

( * ) Notice: Subject to any disclaimer, the term of this patent is extended or adjusted under 35 U.S.C. 154(b) by 373 days.

(21) Appl. No.: 14/147,723

(22) Filed: Jan. 6, 2014

(65) Prior Publication Data

US 2016/0218725 A1     Jul. 28, 2016

Related U.S. Application Data

(60) Provisional application No. 61/750,522, filed on Jan. 9, 2013.

(51) Int. Cl.
| | |
|---|---|
| *H03B 21/00* | (2006.01) |
| *H03L 7/18* | (2006.01) |
| *H03B 1/04* | (2006.01) |

(52) U.S. Cl.
CPC .. *H03L 7/18* (2013.01); *H03B 1/04* (2013.01)

(58) Field of Classification Search
CPC ....... H03L 7/0812; H03L 7/16; H03L 7/113; H03L 7/23; H03L 7/18; H03L 7/1806; H03L 7/183; H03B 28/00
See application file for complete search history.

(56) References Cited

U.S. PATENT DOCUMENTS

| | | | |
|---|---|---|---|
| 4,725,786 | A | 2/1988 | Papaieck |
| 5,821,816 | A * | 10/1998 | Patterson ................ H03L 7/183 327/105 |
| 8,149,022 | B2 | 4/2012 | Wang |
| 2007/0178869 | A1 | 8/2007 | Park et al. |
| 2011/0084771 | A1 | 4/2011 | Nagaraj et al. |
| 2012/0112806 | A1 | 5/2012 | Dayi |

OTHER PUBLICATIONS

Star Dynamics Corporation—XSTAR: Product Detail—Nov. 10, 2011—pp. 1-3.

(Continued)

*Primary Examiner* — Hai L Nguyen
(74) *Attorney, Agent, or Firm* — Louis Isaf; Womble Carlyle Sandridge & Rice

(57) ABSTRACT

An apparatus for synthesizing wideband radio frequency signals in the microwave region has mostly digital components. The apparatus processes and converts a signal from a stable single-frequency electrical oscillator into a lower or higher frequency electrical signal without using analog multiplier or mixer circuits. An apparatus for synthesizing a fixed phase-stable RF reference signal for use in a radar transceiver includes a phase-stable electrical oscillator which produces a single frequency sinusoidal reference signal. The apparatus converts the reference signal to an arbitrary higher or lower fixed frequency using digital logic and signal delays. The apparatus comprises low-jitter comparator, an impulse former, a gearbox retiming circuit and a recirculator circuit. An apparatus for providing wideband FM modulation of an RF signal includes circuitry for synthesizing a radio frequency signal having arbitrary tuning of center frequency and dynamic command of wideband FM and retaining low phase noise performance of the synthesized signal.

10 Claims, 10 Drawing Sheets

(56) References Cited

OTHER PUBLICATIONS

Star Dynamics Corporation—BlueImage R/T—Nov. 2, 2010—pp. 1-2.
Star Dynamics Corporation—SARBAR—Jun. 14, 2010—pp. 1-2.
Star Dynamics Corporation—BlueMax—Nov. 23, 2011—1 Page.
Star Dynamics Corporation—Knowbell—Mar. 20, 2012—pp. 1-2.
International Search Report & Written Opinion dated Mar. 13, 2014, from co-pending International Application No. PCT/US2014/010285.
AMTA 2007 Conference Wrap-up—A Portable Pulsed-IF RCS Measurement System—pp. 5, 6, 7; date: prior to Jan. 8, 2012.

* cited by examiner

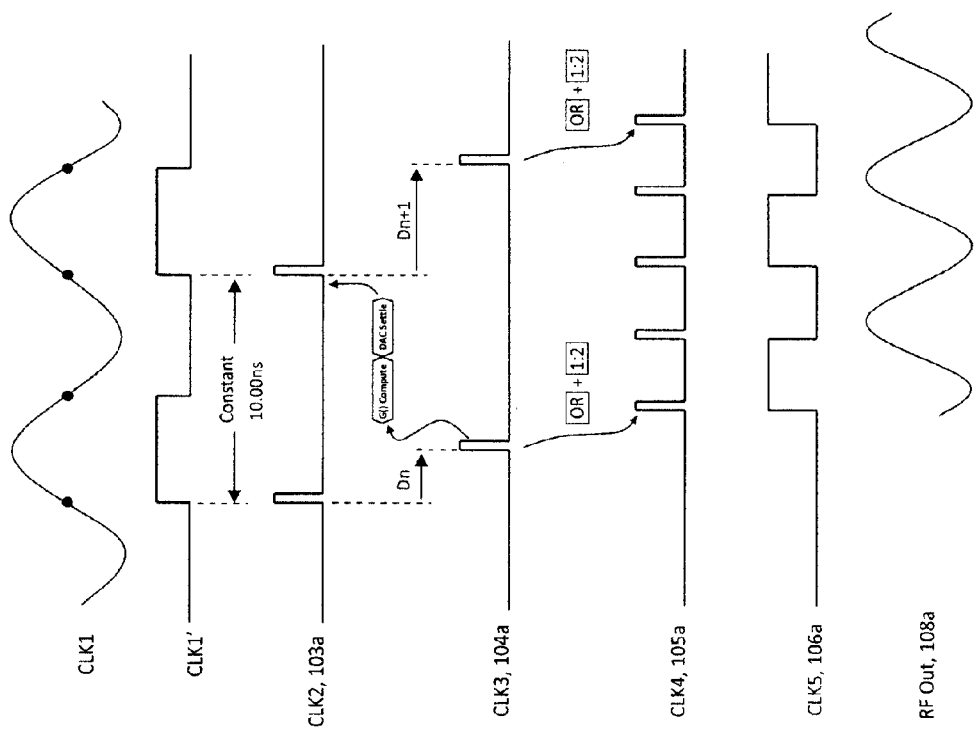

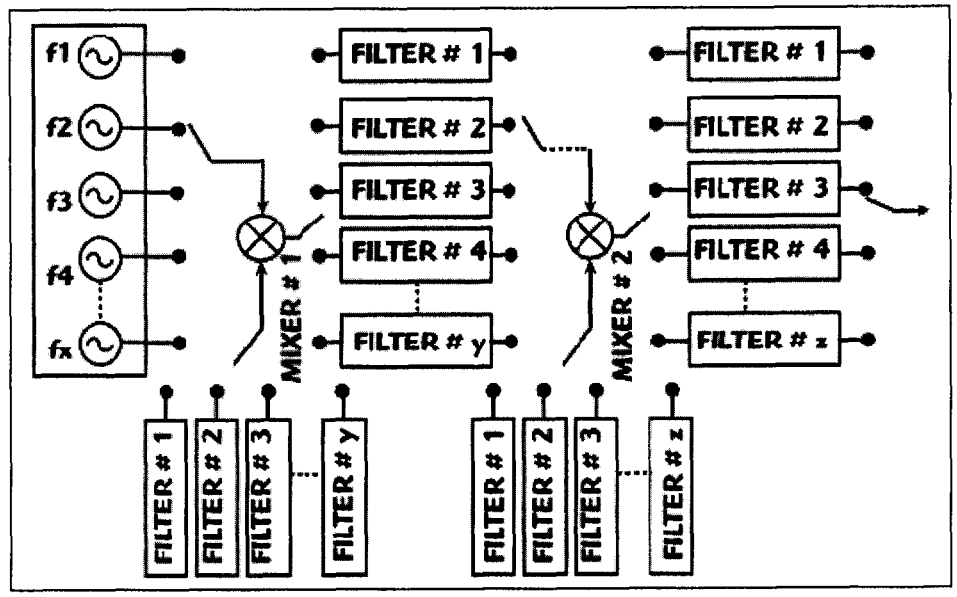
Fig. 8 (PRIOR ART) Typical block diagram of a DAS.
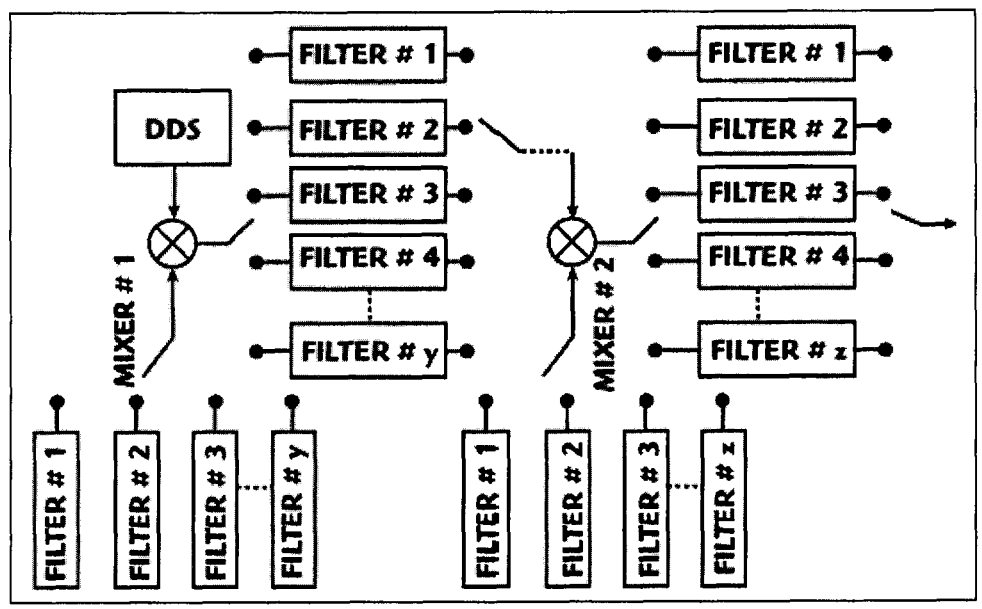
Fig. 9 (PRIOR ART) Typical block diagram of a DAS using DDS at the input

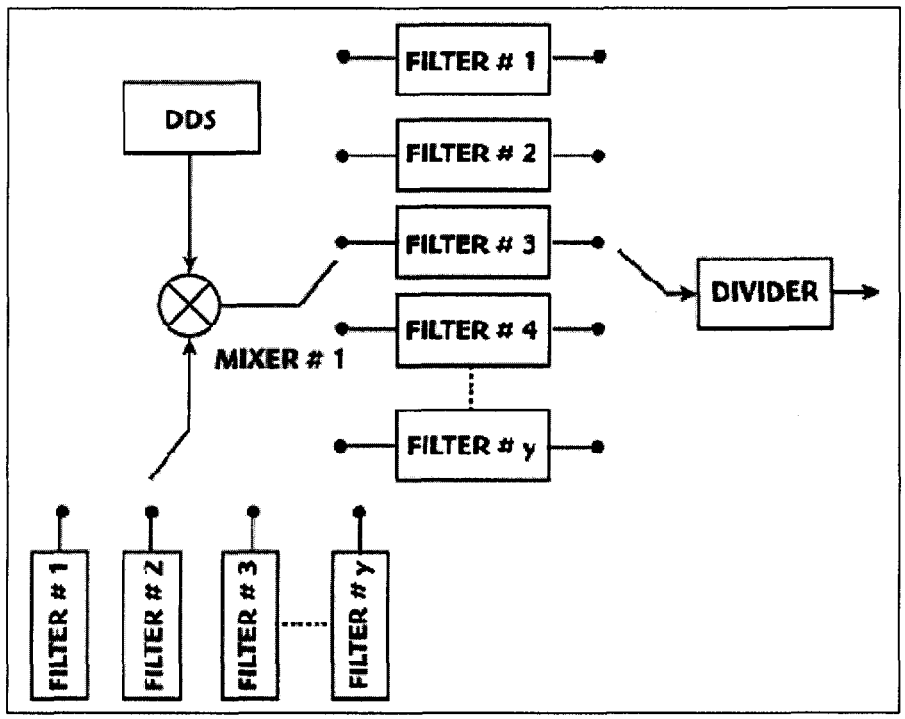
Fig. 10 (PRIOR ART) Typical block diagram of a DDS using a divider at the output
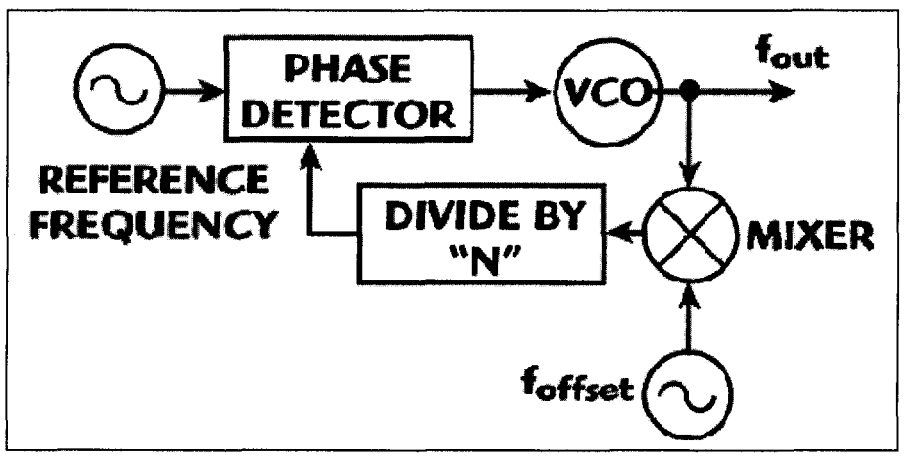
Fig. 11 (PRIOR ART) Typical block diagram of an IFS

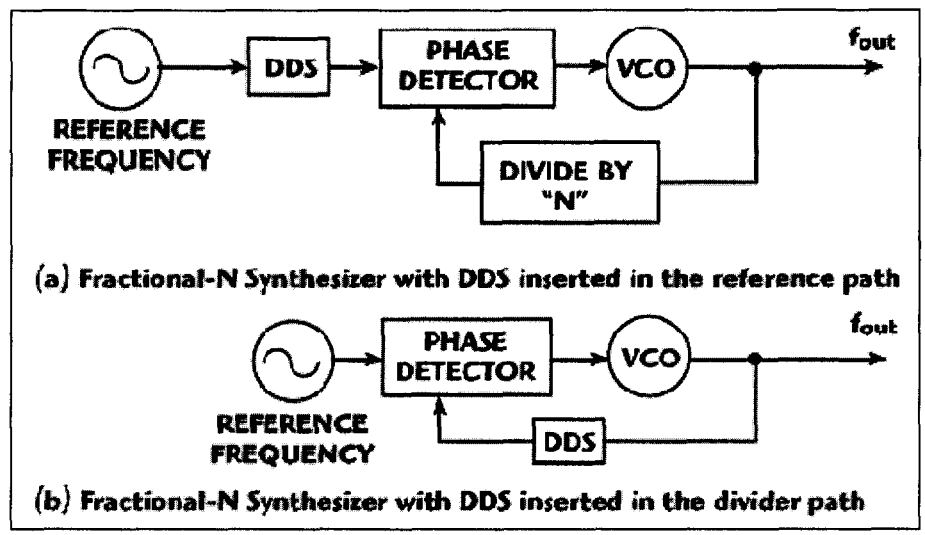
Figs. 12A & 12B (PRIOR ART) Typical block diagrams of a fractional-N synthesizer with DDS inserted

METHOD AND APPARATUS FOR SYNTHESIS OF WIDEBAND LOW PHASE NOISE RADIO FREQUENCY SIGNALS

RELATED APPLICATIONS

The present application claims priority to U.S. Provisional Patent Application No. 61/750,522, filed Jan. 9, 2013.

FIELD OF THE INVENTION

Frequency synthesizers fill many needs in modern communications and radar systems. The present invention relates to the synthesis of radio frequency signals having low phase noise. More specifically, the present invention relates to the generation of low phase noise signals for use as reference signals internal to a precision radar transceiver or other precision radio communications system.

BACKGROUND OF THE INVENTION

General Background information can be found in the following source: http://www.synergymwave.com/Articles/0509/default.asp, retrieved Jan. 2, 2013

Theory and Requirements of Prior Art Synthesizer Systems

Frequency synthesizers come in many shapes and sizes, from tiny system-on-a-chip (SoC) devices and compact modules to rugged military-grade rack-mount systems and bench-top instruments. Available technologies are almost as diverse as the number of package options, using analog methods, digital techniques and often a combination of the two. Frequency synthesizers have traditionally relied on a phase-locked loop (PLL) architecture in which the phase of a tunable oscillator, such as a VCO or YIG-tuned oscillator, is locked to the phase of a reference source with higher stability, such as an oven-controlled crystal oscillator (OCXO).

Basic Requirements

Bandwidth and Frequency Coverage

Bandwidth is vital to the spread of wireless multimedia, instant data, high voice quality and other key services, such as radar performance. However, it is also a limited resource, requiring the use of advanced amplitude- and phase-based modulation formats to squeeze the maximum amount of information into a given portion of bandwidth. One of the most critical components in enabling maximum bandwidth efficiency is the microwave frequency synthesizer. Modern synthesizers leverage available digital techniques to reach the level of noise, stability and resolution needed for most modern communication systems. Therefore, it may be advantageous to develop a broadband "generic" but low cost and power-efficient solution that can cover a number of applications.

Spurs and RF Output Power

Spurs are undesired artifact products generated by synthesizers at discrete frequencies and their location and level are determined by synthesizer architecture and frequency plan. Care must be taken to minimize the spurs' levels down to −80 dBc and below. The RF output power level is another key factor that drives the frequency conversion (up- and down-conversion) mechanism in mixer circuits and can range over wide limits, typically −10 to +18 dBm, although some applications may need even more power.

Phase Noise and Switching Speed

Phase noise is the prime parameter that limits the sensitivity of receivers. Synthesizer close-in phase noise and stability depend on the reference frequency standard and synthesizer topology, which derives its output from the reference. Switching speed (tuning speed) is a demanding parameter for data processing, which determines how fast the synthesizer response jumps from one desired frequency to another. The major challenge a designer faces is increasing the switching speed (<<milliseconds or even <<microseconds) of the synthesizer without sacrificing the performance (phase noise and spurious) as dictated by ongoing increasing data rates of current and later generation communication systems.

Size and Power Consumption

Compact size and low power consumption are key criteria for modern synthesizer technology. Therefore, they are a true motivation towards integrated circuits, avoiding costly, bulky and power hungry YIG-tuned synthesizers. System designers feel persistent pressure to deliver high performance synthesizers in compact size with low power-consumption, including inexpensive solutions. The above limitations (tuning speeds, power consumptions, phase noise, spurious, stability and size) present design challenges and tradeoffs and are likely to be the key driving factors towards overcoming these as well as reducing complexity and cost. Prior art systems synthesize periodic radio frequency signals in the 0-100 Giga-Hertz range. Prior art synthesizer systems can be divided into three distinct categories of electrical architecture: Direct Analog Synthesizer (DAS), Direct Digital Synthesizer (DDS) and Indirect Frequency Synthesizer (IFS).

Synthesizer Architectures

Frequency synthesizers provide the fixed and tunable signals for local oscillators in a wide range of commercial and military communications systems, including wireless base stations. Technologies for creating frequency synthesizers are diverse, from traditional analog methods using PLLs to direct digital synthesizers (DDS) that rely on high-speed digital-to-analog converters (DAC) to transform digital input words into analog output signals. While reviewing classical synthesizer architecture, the current technology trend toward increasing the flexibility and functional integration is specifically addressed as well as reducing its complexity and cost without compromising the phase noise performance and switching speed. Various synthesizer architectures along with their main characteristics are described below.

Direct Analog Synthesizers (DAS)

The function of a synthesizer is translating one or more reference signals to a number of output frequencies with a desired step size. Direct analog synthesizers are conceptualized by mixing base frequencies, followed by switched filters, as shown in FIG. 8. The base frequencies can be obtained from a low frequency high performance signal source (crystal and SAW resonator-based oscillators) or high frequency spectral pure signal source (Dielectric Resonator, Bulk Acoustic Wave Resonator, Sapphire Resonator, Metal Cavity Resonator and Coaxial Resonator-based oscillators) by frequency multiplication, division, phase locking or injection-mode locking. The advantage of DAS is low phase noise (due to high performance base frequency sources extracted from high Q-factor resonator-based oscillators: (crystal/SAW/SRO/CRO) and fast switching speed, but at the cost of step size, design complexity and overall component counts (base frequency source, mixer and filter circuits).

The alternative solution is to incorporate a DDS module at the input of the DAS to increase the minimum step size required from the direct analog approach, as shown in FIG. 9. Again the drawback of this approach is a large amount of undesired mixing products, which can be filtered out with expensive filtering hardware structures if small frequency step size and wide coverage are needed.

Although DAS techniques are a promising solution for reasonably good switching speed and phase noise performance, their applications are limited due to high cost factor.

Direct Digital Synthesizers (DDS)

In contrast to traditional concepts, DDS offers exceptionally fine resolution sub-hertz level, but at the cost of limited usable bandwidth and spurious performances. Therefore, due to bandwidth and spurs limitations, DDS techniques are not attractive for microwave applications and are generally used as a fine frequency resolution module in direct analog or indirect architecture. The above limitations can be overcome by incorporating software and hardware techniques similar to the DAS approach (large number of component counts), followed by a frequency divider, as shown in FIG. 10.

Indirect Frequency Synthesizers (IFS)

FIG. 11 shows a typical single-loop IFS, which utilizes frequency conversion (mixing) in the feedback path to improve the switching speed, phase noise and spurious performances. The drawback of a conventional IFS is degradation in the phase noise performance, due to the large division ratio N, which is required to provide a high frequency output with a fine resolution. In addition, IFS is sensitive to false lock due to undesired mixing products. Using a fractional divider, the overall loop division ratio can be reduced for improved phase noise and tuning speed characteristics.

The problem of false locking can be overcome by incorporating a digital to analog converter (DAC) to provide a sufficiently accurate coarse tune of the VCO to a reasonably correct frequency. This acquisition aid needs linear and repeatable tuning characteristics over the operating frequency band and temperature range. But DACs are noisy and adversely affect the synthesizer phase noise performance if they are not properly removed after the initial frequency acquisition.

For a given step size, fractional-N schemes enable a higher phase detector (PD) comparison frequency, resulting in improved phase noise and tuning speed characteristics. However, the main drawback of the fractional-N topology is high spurious levels due to phase errors inherent to the fractional division mechanism.

IFS architecture strongly depends on the VCO characteristics; therefore, a promising solution is to use a low phase noise and fast switching compatible VCO, including a DDS module as a fractional divider, inserted into the reference or divider path (see FIGS. 12A and 12B). This approach leads to a complex hardware architecture, but offers a cost-effective high performance solution. Although high performance synthesizer compatible VCO solutions complicate the overall design philosophy, the complexity can be effectively spread and optimized, which leads to a high performance and reasonably priced frequency generation and synthesis solutions for current and later generation communication systems.

Synthesizer Compatible VCOs

Historically, synthesizer designers have relied on YIG oscillators, characterizing broadband operation with excellent phase noise performance. The YIG oscillator offers linear tuning characteristics that simplify the synthesizer coarse-tuning algorithm in multi-loop schemes. These unique features allowed the YIG-based synthesizers to dominate over the last decades. But YIG oscillators are power hungry and require larger real estate area, which recently contributed to a transition to printed coupled resonator-based solid-state VCO architectures. Since the printed resonator-based VCO noise performance is inferior to its YIG counterpart, care must be taken in choosing spectral pure reference frequency sources (crystal oscillators). The typical phase noise performance of commercially available 100 MHz crystal oscillators is −168 dBc/Hz at 10 kHz offset from the carrier. The phase noise at 10 kHz offset for a 100 MHz crystal oscillator can be translated to −128 dBc/Hz for a 10 GHz output, which even supersedes the performance of commercially available low cost YIG oscillators In summary, prior art systems comprise a stable signal from a single-frequency oscillator (typically in the 1-100 Mega-Hertz range). To synthesize arbitrary higher or lower frequencies prior art systems processes the single-frequency signal through analog RF multipliers, mixers and band pass filters. In typical prior art, many circuit stages of multiplication, mixing and filtering are required to synthesize the final desired signal.

Prior art synthesizers are costly. Typical 2013 prices exceed US $100,000 for a single channel of synthesized signal. Prior art systems are limited in the speed at which they can be commanded to change to a new output frequency (typically 300 nano-seconds to 1 micro-second). Prior art systems are physically large weighing typically 50 lbs or more and require typically more than 100 watts of input power to operate. Reference Comstron Model FS-5000 and similar variant models manufactured by Comstron, Inc.

SUMMARY OF THE INVENTION

The present invention overcomes the limitations of prior art Direct Analog Synthesizer (DAS), prior art Direct Digital Synthesizer (DDS) and Indirect Frequency Synthesizer (IFS). The present invention introduces the new category of Time Delay Synthesizer (TDS). The present invention relates to a TDS apparatus for synthesizing low phase noise RF signals in the frequency range of 0-100 Giga-Hertz (GHz). A TDS apparatus for synthesizing wideband radio frequency signals has mostly digital components. The TDS apparatus converts a stable low frequency electrical oscillator into a higher radio frequency electrical signal without employing traditional analog multiplier or mixer circuits.

A TDS apparatus can provide a stable radio frequency reference signal for use in a radar transceiver. The apparatus includes a stable low frequency electrical oscillator which produces a single frequency sinusoidal reference signal. The apparatus converts the reference signal to a higher or lower frequency using digital logic and variable signal delays. The apparatus employs a low-jitter comparator, an impulse former, a gearbox retiming circuit and a recirculator circuit.

A TDS apparatus for providing wideband FM modulation of an RF signal has includes circuitry for synthesizing a radio frequency signal having wideband arbitrary FM modulation with low phase noise.

The present invention relates to a TDS apparatus for providing a periodic reference signal for use in a radar transceiver. The apparatus comprises a phase stable low frequency crystal reference source which produces a low phase noise single frequency sinusoid. The TDS apparatus converts a stable low frequency electrical oscillator into a higher frequency electrical signal without the use of prior art analog multiplier or mixer circuits. The apparatus comprises a coax output port to which a cable is connected to deliver the signal produced by the apparatus.

The present invention synthesizes radio frequency signals for use as precision reference signals inside equipment such as radio communications transceivers, satellite communications transceivers and radar transceivers.

BRIEF DESCRIPTION OF THE DRAWINGS

In the accompanying drawings, the preferred embodiment of the invention and preferred methods of practicing the invention are illustrated in which:

FIG. 7 shows a digital logic timing diagram for internal signals of the preferred embodiment of the invention.

FIG. 8 shows a block diagram of a typical prior art Direct Analog Synthesizer (DAS).

FIG. 9 shows a block diagram of a typical prior art Direct Analog Synthesizer (DAS) using a Direct Digital Synthesizer (DDS) at the input.

FIG. 10 shows a block diagram of a typical prior art Direct Digital Synthesizer (DDS) using a divider at the output.

FIG. 11 shows a block diagram of a typical prior art Indirect Frequency Synthesizer (IFS).

FIGS. 12A and 12B show block diagrams of a typical prior art Fractional-N Synthesizer (FNS) with DDS inserted in the reference path (FIG. 12A) and in the divider path (FIG. 12B).

DETAILED DESCRIPTION

Figure 1:
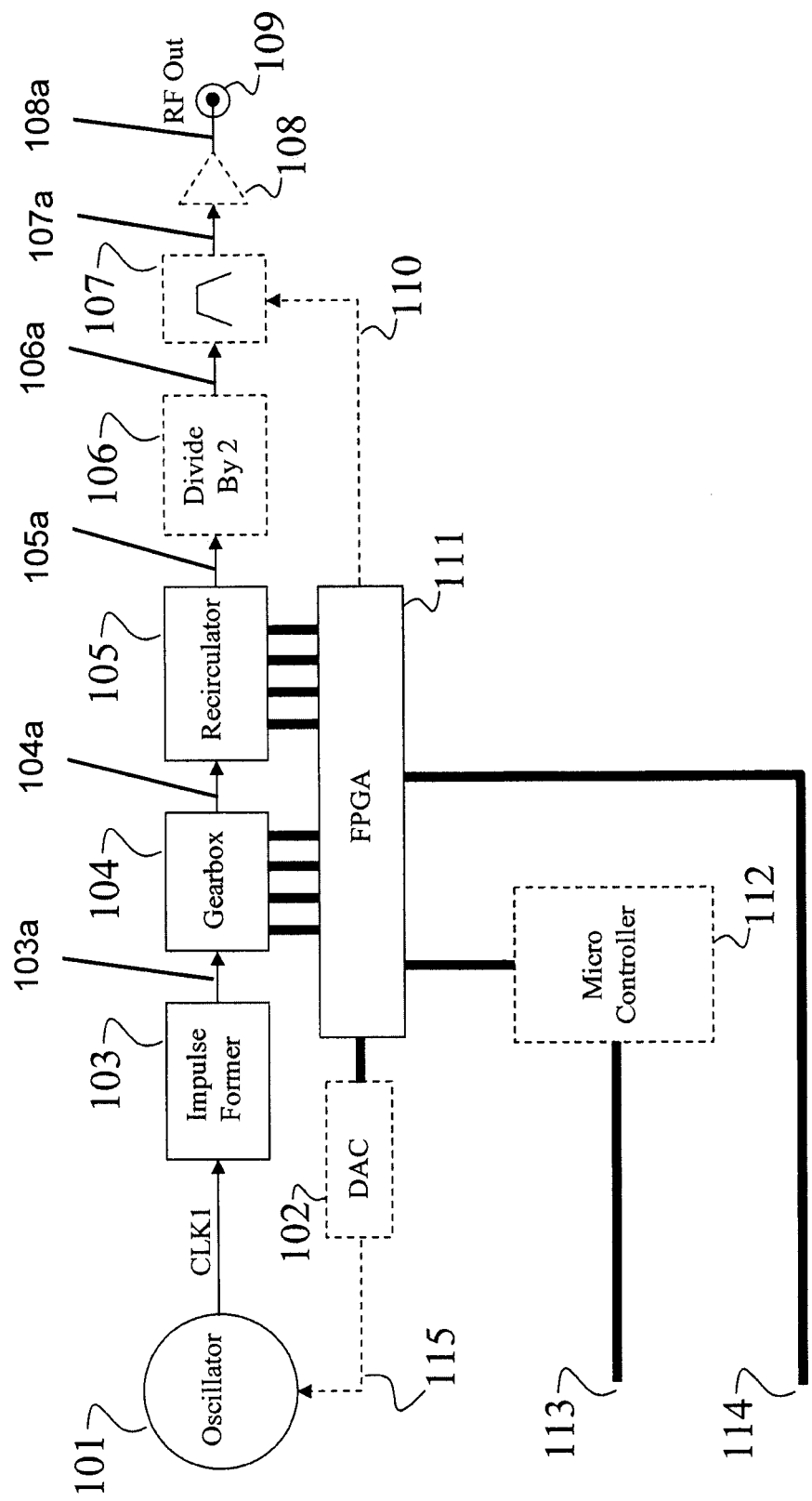
FIG. 1 shows a block diagram of the preferred embodiment of the invention.

Referring now to the drawings wherein like reference numerals refer to similar or identical parts throughout the several views, FIG. 1 shows an overall block diagram of one embodiment of the present invention.

A commercially available crystal oscillator 101 generates a single frequency low phase noise sinusoidal electrical signal. The oscillator 101 may be a "Golden Citrine Oscillator" manufactured by Wenzel Associates, Inc., Austin, Tex. The oscillator center frequency is 100.000 Mega Hertz having phase noise of −183 dBc/Hz. Crystal oscillator 101 is configured to receive a voltage input signal 115 which allows fine adjustment of the frequency of the crystal up or down within 1% of the center frequency. As seen in FIG. 1, the voltage input signal 115 is provided by first Field Programmable Gate Array FPGA 111 (FPGA) via a digital-to-analog (DAC) converter 102.

The first FPGA 111 itself receives first control signals from a microcontroller 112 configured to communicate with other components of the overall system via a first communication bus 113, and data signals from other components of the overall system via a second communication bus 114. For slow control of the invention, communication bus 133 may comprise USB, Ethernet, RS-232, CANBUS, Wi-Fi, or other commercially popular communication bus. For fast control of the invention, bus 113 and microcontroller 112 may be eliminated from the invention and second communication bus 113 can become the only first source of fast control information to the first FPGA 111. The first FPGA 111 is further configured to control other components of the present synthesizer, such as the filter 10, via one or more additional internal buses 110.

Oscillator 101 produces sinusoidal signal CLK1 of Frequency $F_0$=100.000 MHz which drives Impulse Former 103. Impulse Former 103 produces a very short digital pulse having a pulse width of 10-20 picoseconds, the exact pulse width not being critical to the operation of the invention. Impulse Former 103 produces one short pulse for each cycle of signal CLK1 from oscillator 101, thereby creating a first pulse train 103a having a first timing interval between pulses and a first frequency.

The Gearbox 104 receives the pulses in the first pulse train 103a from Impulse Former 103 and is configured to dilate or compress the time interval between consecutive pulses according to commands from the first FPGA 111, to thereby create a second pulse train 104a which is time-scaled relative to the first pulse train. In other words, the gearbox 104 dilates or compresses the first timing interval between pulses of the first pulse train to create the second pulse train 104a having a second timing interval different from the first timing interval, and a second frequency different from the first frequency.

The gearbox is configured by the first FPGA 111 to, among other things, fine tune the frequency, scale the frequency either upward or downward, and/or make other adjustments to the spacing between the short pulses.

The Recirculator 105 receives the second pulse train 104a from Gearbox 104 and inserts additional pulses, generally at regular intervals, between consecutive pulses in the time-scaled second pulse train 104a. This results in a third pulse train 105a having a frequency higher than the frequency of the second pulse train 104a output by the Gearbox 104.

The third pulse train 105a is input to a Divide-by-2 unit 106 which reduced the frequency of the high-frequency pulse train in half. In one embodiment, the Divide-by-2 unit 106 comprises a Toggle flip-flop to divide the frequency in half thus producing a 50/50% duty cycle digital square wave signal 106a.

Optional band pass filter 107 removes some of the harmonic content of the square wave signal 106a to thereby produce a high-frequency sinusoidal signal 107a suitable for driving the optional RF amplifier 108.

RF Amplifier 108 amplifies the high-frequency sinusoidal signal 107a and further reduces its harmonic content, to thereby output a synthesized high-frequency sinusoidal signal 108a.

Coax connector 109 delivers the synthesized high-frequency signal 108a to other radar or communications equipment.

Phase Noise

If the oscillator signal 101 is represented mathematically by the function $f(t)=\cos(\Omega t+\theta)$, frequency multiplication by N multiplies the cosine function argument $(\Omega t+\theta)$ by N, giving $f'(t)=\cos(N(\Omega t+\theta))=\cos(N\Omega t+N\theta)$. Consequently any phase noise term in the θ is also multiplied by N.

When the switch 116 is closed, the resulting output signal 105a from Recirculator 105 will have increased phase noise of 20 Log (N) dB or worse since Recirculator 105 performs frequency multiplication by N, which multiplication is disciplined by signal 103a derived from signal CLK1 from Oscillator 101.

By way of example, assume that Oscillator 101 has a measured phase noise of −183.0 dB/Hz. Assume that Impulse Former Circuit 103 and Gearbox circuit 104 acting together further degrade the phase noise such that signal 103a has a phase noise of −180.0 dB/Hz. Assume that the output frequency of the invention is set to 8.543 GHz as measured at signal 106a. This dictates that signal 105a will have a frequency of 17.086 GHz. Therefore the new phase noise of signal 105a is given by the equation 20 Log (N) dB where N=17.086 GHz/100.000 MHz=170.86. In practice Recirculator 105 will be programmed to result in N being the nearest integer whole number which in this case would be 171. Therefore the phase noise is increased by 20 Log(171) dB or 44.7 dB. The resulting phase noise of signal 105a is −180.0 dB+44.7 dB=−135.3 dB.

If, again, signal 105a is represented mathematically by the function f(t)=cos(Ωt+θ), division by N divides the cosine function argument (Ωt+θ) by N. Consequently any phase noise term in the θ is also divided by N. The resulting output signal will have decreased phase noise of 20 Log(N) dB. For Divide by 2 106, N=0.5 and 20 Log(0.5)=−6.0 dB. Therefore signal 106a will have improved phase noise versus signal 105a. The phase noise of signal 106a will be −135.3 dB−6.0 dB=−141.3 dB.

In another embodiment of the invention the switch 116 is opened for short periods of time. During these short periods of time the phase noise attributed to Oscillator 101 is not coupled to signal 105a since Recirculator 105 produces pulses in free-running mode not being disciplined by Gearbox signal 104a. During these short periods of time, certain equipment such as radars and some communications systems can benefit greatly from phase noise that is lower then what is obtainable when switch 116 is closed. In this manner the invention can switch between "calibrate" when switch 116 is closed and "use" when switch 116 is open to achieve desired precision, as needed, for a given application of the synthesized signal.

Impulse Former 103

Figure 2:
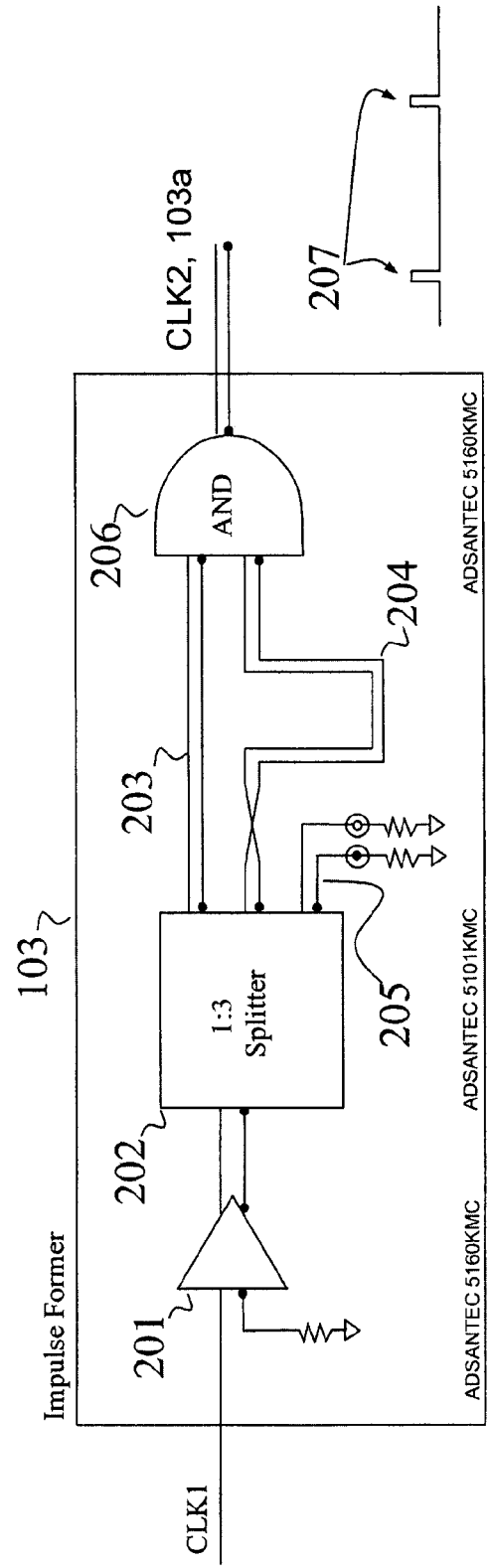
FIG. 2 shows internal details of the Impulse Former circuit.

FIG. 2 shows details of the Impulse Former 103. Single-ended signal CLK1 is connected to the positive input port of limiting amp 201 having a gain of +35 dB or more. Limiting amp 201 converts signal CLK1 from sinusoidal to square wave having low jitter low phase noise rising edges. Limiting amp 201 also converts the signal CLK1 from single-ended ground reference format to differential voltage format. By way of example limiting amp 201 is of type 5160KMC manufactured by ADSANTEC Inc, Rancho Palos Verdes, Calif. or other equivalent component.

Splitter 202 receives the low phase noise differential format square wave signal and splits it into 3 identical differential signals. A first of these, signal 203, is wired to the input of AND gate 206. A second of these, signal 204, is inverted in polarity by flipping the two differential signal lines and is connected to AND gate 206 through signal path delay that is longer than the signal path delay of signal 203. Third of these, signal 205, is simply grounded and thus not used in this embodiment.

The differential in signal path delay between signal 203 and signal 204 can be realized by constructing the transmission lines for signals 203 and signal 204 using different length wires or coax, or strip line circuit board traces. By way of example, the differential time difference Td1 between signal line 203 and 204 is 10-20 picoseconds but may be more or less in other embodiments of the invention.

AND gate 206 produces signal CLK2 having a series of short pulses. The rising edge of each pulse corresponds to the start of each new cycle of signal CLK1. Timing diagram 207 depicts two cycles of digital signal CLK2. By way of example the time between consecutive rising edges of CLK2 is 10.000 nanoseconds when Oscillator 101 has a stable frequency of 100.000 Megahertz. It is understood that CLK2 is the first pulse train 103a seen in FIG. 1.

Gearbox 104

Figure 3:
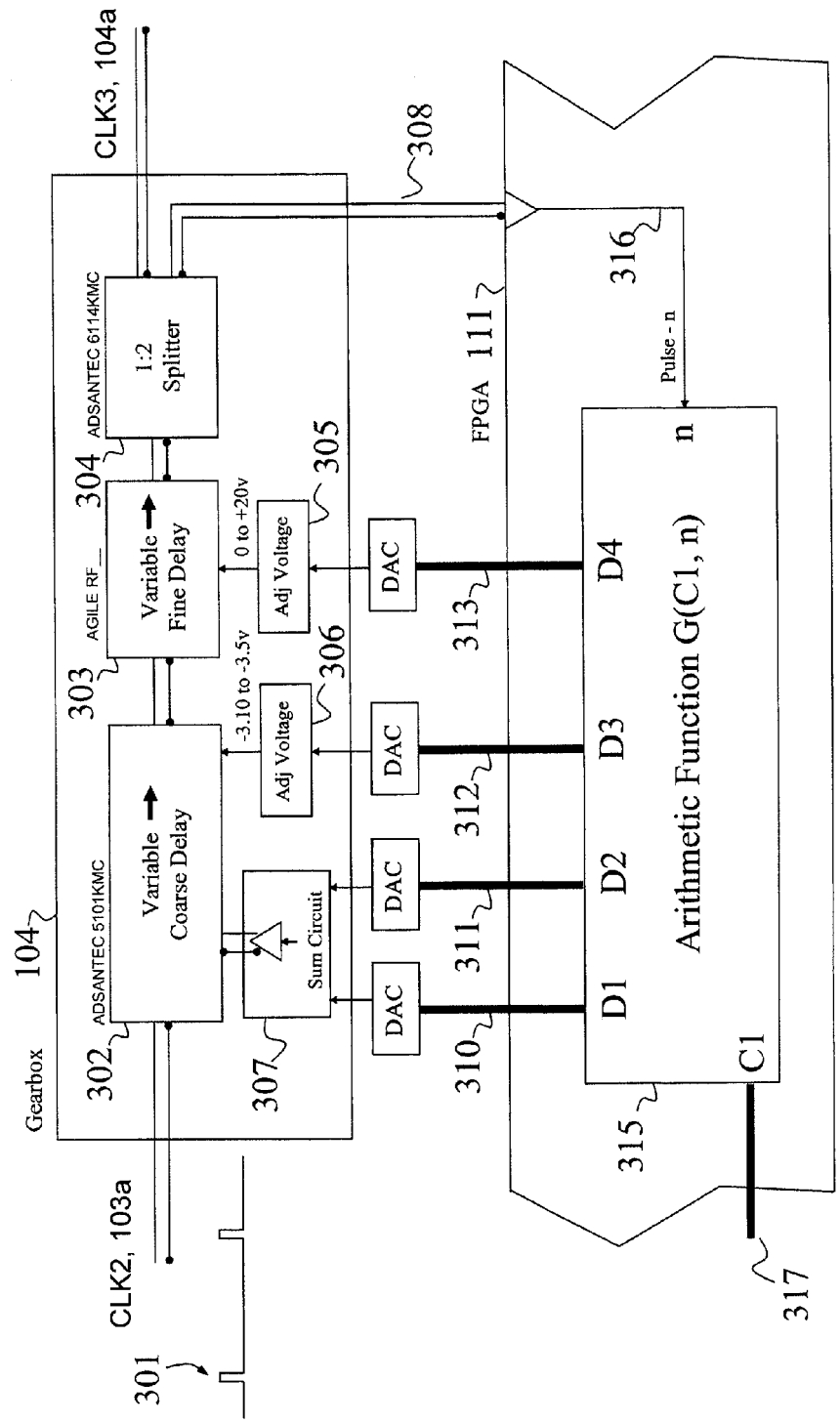
FIG. 3 shows internal details of the Gearbox circuit.

FIG. 3 shows the details of Gearbox 104. Signal CLK2 (first pulse train 103a) comprising pulses 301 having a first inter-pulse timing, is received by Variable Coarse Delay 302. First adjustable voltage source 306 and Sum Circuit 307 are connected at the supply voltage and control voltage to 302. Digital data buses 310, 311, and 312 provide commands Digital to Analog Converters which produce variable voltages to adjustable voltage source 306 and sum circuit 307. Acting together as a group, data buses 310, 311 and 312 control the amount of variable time delay applied by 302 to CLK2.

Variable Fine Delay 303 receives a delayed version of signal CLK2 from variable coarse delay 302 and applies additional fine timing delay to the signal as commanded via data bus 313 acting through a second adjustable voltage source 305.

Splitter 304 receives the total delayed signal from variable fine delay 303 and produces two identical copies of the signal as CLK3 (second pulse train 104a) and signal 308.

First FPGA 111 differential signal 308 and converts it to single ended gearbox feedback signal 316 "Pulse-n". First arithmetic function G(n) is programmed into a first logic section 315 of first FPGA 111. First arithmetic function G(n) computes new digital values for outputs D1, D2, D3, and D4 in response to adjustment . Taken together as a group, digital words D1-D4 specify the total delay time from a rising edge of CLK2 to the next rising edge of CLK3. New values are computed for D1-D4 each gearbox feedback time signal 316 pulses. In this manner, the total time delay presented to gearbox 104 is changed for every cycle of CLK3. Digital control word 317 provides command input C1 to first arithmetic function G(n), where C1 is typically a 64 bit control word:

First arithmetic function G(C1, n) controls the signals on the data buses 310-313 in response to digital control word input 317 and gearbox feedback time signal 316, in accordance with the following arrangement:

G(C1, n):
D1:=LUT1(C1[bits63-47]);
D2:=LUT2(C1[bits47-30]);
D3:=LUT3(C1[bits32-14]); and
D4:=LUT4(C1[bits15-0]);
where:
(i) LUT1, LUT2, LUT3, LUT4 are comprised of Look-Up-Table memories which are loaded with static or dynamic delay constants to adjust the calibration of the output frequency of the invention; and
(i) input n serves to increment a counter that addresses the Look-Up-table by some address increment.

First FPGA logic section 315 re-computes first arithmetic function G(n) for each consecutive pulse of gearbox feedback signal 316, which typically occurs at a periodic rate ranging from 5 nanoseconds to 20 nanoseconds, a time well within the speed range of commercially available low cost FPGA components.

Recirculator 105

Figure 4:
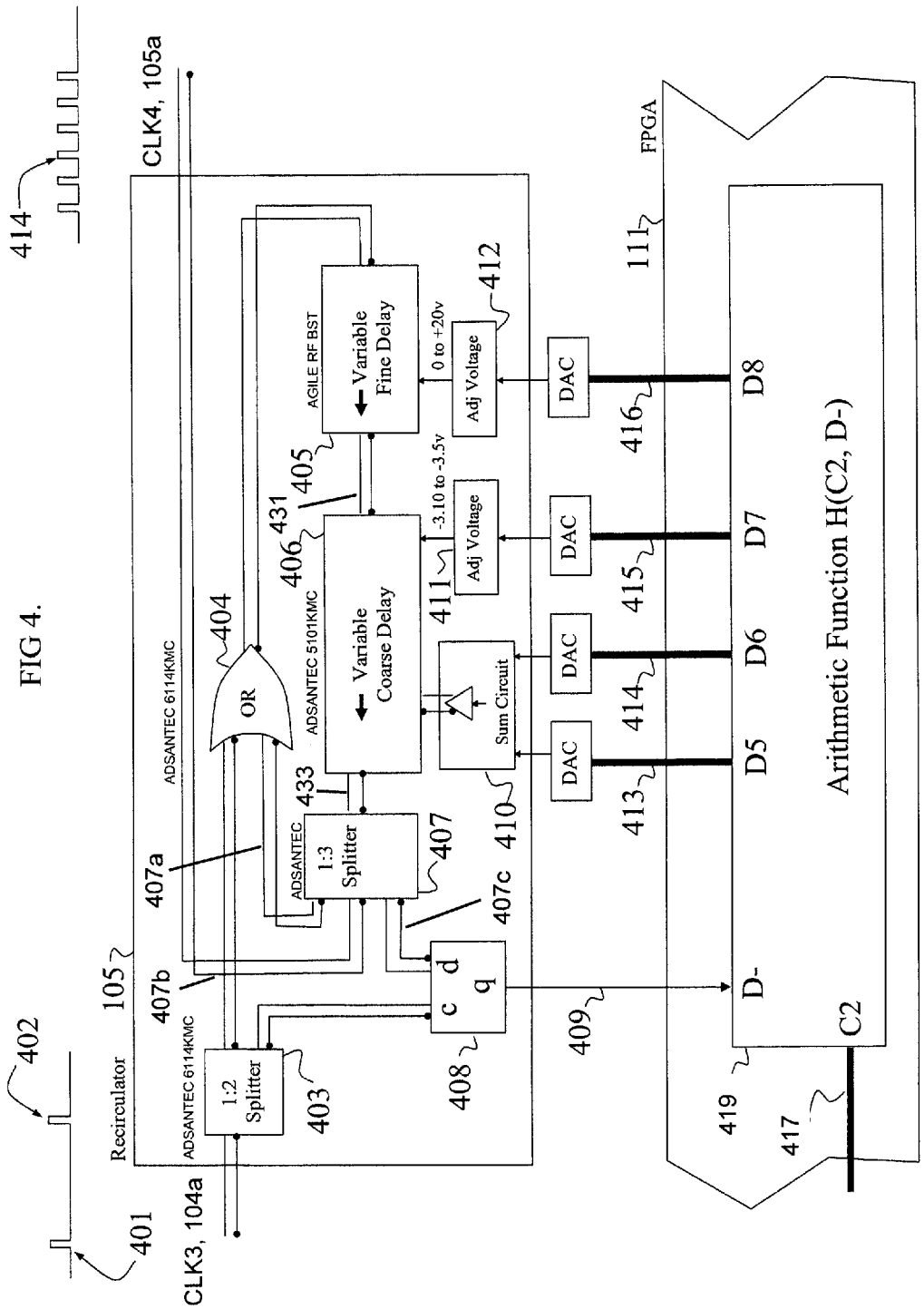
FIG. 4 shows internal details of the Recirculator circuit.

FIG. 4 shows the details of Recirculator 105. Signal CLK3 (second pulse train 104a) having pulses 401, 402 with a second inter-pulse timing which has been processed by Gearbox 104 (making it different from inter-pulse timing for pulses 301 of CLK2) is received by recirculator first splitter 403.

OR gate 404 top input receives a copy of signal CLK3 from the recirculator first splitter 403 and passes the time-scaled short pulses at CLK3 to the Variable Fine Delay 405.

Variable fine delay unit 405 delays the pulse output by the OR gate 404 in accordance with signals on control bus 416, as modified by a DAC and Adjustable Voltage unit 412. Variable fine delay unit 405 then outputs a finely delayed pulse 431 based on the output of the OR gate 404. In one embodiment, the variable fine delay unit 405 employs high-precision BST (barium-strontium-titanate) capacitors, which may be electronically tunable, and can help realize sub-picosecond delay control Variable Coarse Delay unit 406 receives the finely delayed pulse 431 from the variable Fine Delay unit 405 and further delays it by an amount of time collectively prescribed by arithmetic function outputs D5-D7, supplied via buses 413, 414 and 415 and Adjustable Voltage circuits 410 and 411. Second arithmetic function H(n) is programmed into a second logic section 419 of the first FPGA 111. Variable Coarse Delay unit 406 outputs a fully delayed pulse 433 to recirculator second splitter 407, in response to the finely delayed pulse 431 and the signals from the arithmetic function outputs D5-D7.

Recirculator second splitter 407 creates three copies of the fully delayed pulse 433 output by Variable Coarse Delay unit 406. The first copy of the fully delayed pulse 433 formed at recirculator second splitter first output 407a is applied to the bottom input of OR gate 404. OR gate 404 now produces a second pulse output in addition to the first pulse output that was produced at the output of OR gate 404 as described earlier. Short pulses continue to travel through the circular processing loop comprised of OR gate 404, variable fine delay unit 405, variable coarse delay unit 406, and recirculator second splitter 407 and back again to OR gate 404.

The result of the repeating loop is that a stream of continuous short pulses is created at the recirculator second splitter second output 407b which is outputted from recirculator 105 as signal CLK4 (third pulse train 105a). Signal CLK4 is a digitally multiplied version of signal CLK3. The mathematical frequency multiplication factor is equal to the period of CLK3 divided by the total time delay for a signal to propagate through circuit loop 404 to 405 to 406 to 407 and back again to 404.

Timing diagram 414 shows a typical timing waveform for digital signal CLK4 where digital control words D5-D8 have been set to produce 5 pulses for every 1 pulse of CLK3. Error signal 409 comprises a digital error signal which is used to adjust second arithmetic function H(n) such that any given pulse from CLK3 aligns perfectly in time with some pulse in signal CLK4.

Circuit element 408 of the recirculator 105 is a D Flip-Flop having Clock input "c" and data input "d" and Q output "q". The CLK3 signal from the recirculator first splitter 403 is applied at the D Flip-Flop's clock input 'c', and the recirculator second splitter third output 407c is applied at the D Flip-Flop's data input 'd'. Circuit element 408 serves as a timing comparator.

If the CLK3 signal rising edge arrives at the clock input "c" and the pulse input 408d has not yet arrived at the data input 'd' from the recirculator second splitter third output 407c, then error signal 409 will be logic low, indicating to the FPGA D– input that second arithmetic function H(n) should be adjusted slightly to increase total delay time prescribed by D5-D6.

If CLK3 signal rising edge arrives at the clock input "c" and the pulse input to 408d has already arrived at the data input 'd' from the recirculator second splitter third output 407c, then error signal 409 will be logic high indicating to the FPGA D– input that second arithmetic function H(n) should be adjusted slightly to decrease the total delay time prescribed by D5-D6. Digital control word 417 provides command input C2 to second arithmetic function H(n), where C2 is typically a 64 bit control word:

Second arithmetic function H(C2, D–) controls the signals on the data buses 413-416 in response to digital control word input 417, in accordance with the following:

H(C2,D–):
D5:=LUT5(1/C2[bits63-47]);
D6:=LUT6(1/C2[bits47-30]);
D7:=LUT7(1/C2[bits32-14]); and
D8:=LUT8(1/C2[bits15-0]);
where:
(i) LUT5, LUT6, LUT7, LUT8 are comprised of Look-Up-Table memories which are loaded with static or dynamic delay constants to adjust the calibration of the output frequency of the invention; and
(ii) input D– serves to adjust the values stored in the Look-Up-table.

Error signal 409 is ignored by the D– input and function H(n) during use of the synthesized signal. In this manner the synthesized signal does not suffer frequency or phase adjustment noise during use. During periods of calibration, the D– input is used by second arithmetic function H(n) to make slight corrections to the frequency multiplication factor. In practical applications, such as Radar or Radio communications, the invention can switch between "calibrate" and "use" to achieve desired precision, as needed, for a given application of the synthesized signal.

User Command and Control of the Invention

Figure 5:
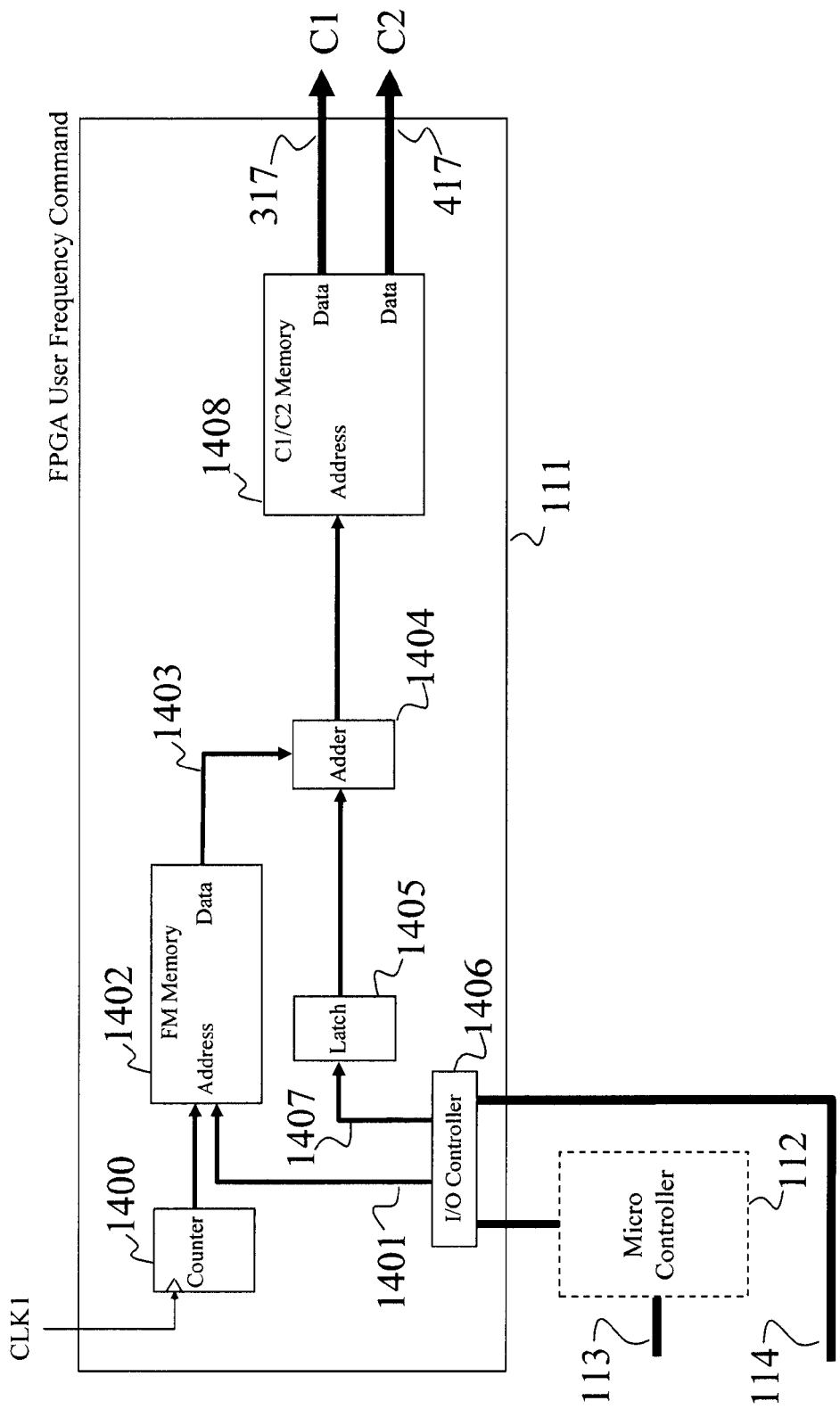
FIG. 5 shows a block diagram of one embodiment of FPGA circuitry for formatting user frequency command and control to implement wideband FM modulation having fast agility of modulation waveform.

FIG. 5 shows the details of user command and control of the invention which are comprised inside FPGA 111.

C1/C2 Memory 1408 holds pre-programmed memory values for Command and Control words C1 317 and C2 417 which control the Gearbox and Recirculator as shown in FIG. 3 and FIG. 4 respectively.

User data bus 113 or user data bus 114 supply the selected frequency as well as information about the FM modulation type. I/O Controller 1406 decodes the command and control signals into first information 1401 used to help determine an FM modulation type and second information 1407 used to help determine a base frequency. By way of example first and/or second information 1401 or 1407 could be changed by the user at a 10 ns update rate using commercially available FPGA digital logic.

Latch 1405 holds the second information 1407 for helping select the base frequency value and Adder 1404 adds the incremental FM change value 1403 from FM memory 1402 to the second information 1407 from latch 1405. The resultant binary frequency value is sent via bus 1404 to C1/C2 memory 1408 where it is treated as an address that points to a first location in the C1/C2 Memory 1408 to establish base frequency.

Fast FM Modulation Command and Control

Signal CLK1 from Oscillator 101 increments a counter 1400. The counter output comprises the least significant bits of address to FM Memory 1402. The first information 1401 comprises the most significant bits of address to FM Memory 1402. Thus, the first information 1401 sets the mode of FM modulation by causing FM Memory 1402 to jump to sub-tables within the total memory space, each sub-table comprising data values to produce different types of FM modulation.

By way of example the following binary address codes select eight different sub-tables:
000=Linear FM Sawtooth,
001=Triangle FM Sawtooth
010=FM sinusoidal 011=No FM modulation
100=Arbitrary FM modulation style 1
101=Arbitrary FM modulation style 2
110=Other
111=Other Referring still to FIG. 5, by way of example if CLK1 is 100.000 MHz, then Counter 1400 will increment its count value every 10 ns. In this manner FM Memory 1402 will scan through modulation values at a rate of 100 million new values per second. This scanning process produces 100 million new C1 317 and C2 417 command values per second. In this manner, the synthesizer of the present invention can switch frequencies at an extremely fast rate of 10 ns as compared with prior art synthesizers which switch frequency at rates not exceeding about 400 ns.

Figure 6:
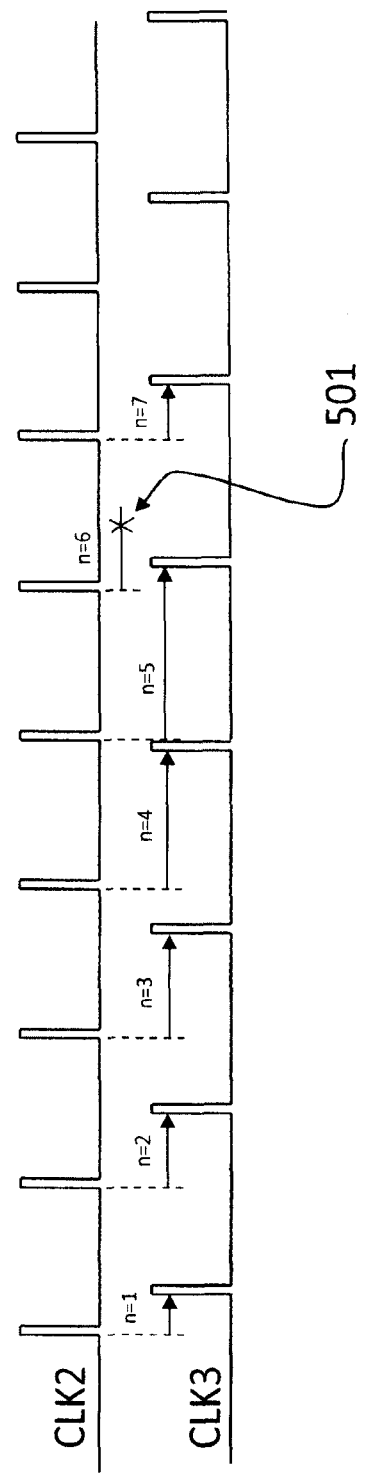
FIG. 6 shows a digital logic timing diagram for gearbox input signal CLK2 and gearbox output signal CLK3.

FIG. 6 shows a digital logic timing diagram for gearbox input signal CLK2 and gearbox output signal CLK3. As discussed above, the gearbox 104 adjusts the time interval between consecutive pulses of the first pulse train 103a, to thereby change a frequency thereof. As seen in the time interval dilation example FIG. 6, if each of several individual short pulses are shifted by an arithmetically increasing time interval, a superfluous pulse 501 will ultimately be skipped, when the time shift associated with a particular pulse (in this case pulse 6) results in the next pulse (in this case pulse 7) being "lapped".

FIG. 7 shows digital logic timing diagrams for internal signals of the preferred embodiment of the invention. As seen in the timing diagrams of FIG. 7, the sinusoidal signal CLK1 from the oscillator 101, when subject to a virtual thresholding operation, creates a square wave, indicated by CLK1'. The rising edges of the square wave CLK1' are converted by the impulse former 103 into signal CLK2 (first pulse train 103a). The gearbox 104 then dilates or compressed the time interval between the pulses of signal CLK2 into CLK3 (second pulse train 104a). The recirculator 105 upconverts the frequency of CLK3 into CLK4 (third pulse train 105a) by inserting additional pulses between the pulses of the second pulse train 104a. The divide-by-2 unit 106, downconverts CLK4 into a 50/50% duty cycle digital square wave signal 106a, which may ultimately be expressed as synthesized high-frequency signal 108a.

There are certain differences in the operation and design of a frequency synthesizer in accordance with the present invention as opposed to those in the prior art. In contrast to prior art frequency synthesizers which change the control word every period, a synthesizer in accordance with the present invention changes the word on every cycle, for more precise control. Also in contrast to prior art frequency synthesizers which employed switched capacitors to change delay (and are not useful at frequencies above 5 GHz), a synthesizer in accordance with the present invention employs high-precision BST capacitors, which may be tunable and may permit sub-picosecond delay control.

U.S. Provisional Patent Application No. 61/750,522, filed Jan. 9, 2013, is incorporated herein in its entirety by this reference.

Although the invention has been described in detail in the foregoing embodiments for the purpose of illustration, it is to be understood that such detail is solely for that purpose and that variations can be made therein by those skilled in the art without departing from the spirit and scope of the invention except as it may be described by the following claims.

What is claimed is:

1. An apparatus for synthesizing sinusoidal radio frequency signals comprising:
   an oscillator configured to output a first sinusoidal signal having a first frequency;
   an impulse former configured to convert the first sinusoidal signal into a first pulse train having a first timing interval between pulses;
   a gearbox configured to dilate or compress the first timing interval between pulses of the first pulse train to thereby create a second pulse train having a second timing interval between pulses and a second frequency;
   a recirculator configured to delay and add pulses in the second pulse train, to the second pulse train itself, to thereby form a third pulse train comprising pulses having a third timing interval between pulses and a third frequency, the third timing interval being less than the second timing interval; and
   circuitry to convert the third pulse train into an RF signal.

2. The apparatus according to claim 1, wherein:
   the gearbox is configured to skip a pulse of the first pulse train during a dilation operation.

3. The apparatus according to claim 1, further comprising a first field-programmable gate array (FPGA) configured to:
   provide first control signals to the gearbox;
   provide second control signals to the recirculator; and
   provide third control signals to the oscillator to control a frequency of the oscillator.

4. he apparatus according to claim 3, wherein:
   the recirculator comprises an all-digital loop configured to insert additional pulses into the second pulse train to thereby form the third pulse train.

5. The apparatus according to claim 4, wherein:
   the recirculator comprises circuitry to adjust a time delay of the second pulse train based on delay constants stored in a look-up able and indexed by addressing information output by a counter.

6. The apparatus according to claim 4, wherein:
   the recirculator further comprises a timing comparator configured to determine a timing difference between at least one pulse in the second pulse train, and at least one pulse in the third pulse train being formed, and output an error signal in response thereto, the error signal being provided to the first FPGA to adjust a delay associated with creating the third pulse train.

7. The apparatus according to claim 6, wherein:
   the error signal is used, in part, to address entries in a look-up table, said entries comprising information from which said second controls are created.

8. The apparatus according to claim 1, further comprising a frequency adjustment circuit configured to:
   compare the second frequency with a selected frequency to create a difference signal;
   in response to the difference signal, adjust control data to calibrate the system to mitigate against temperature changes and/or component aging; wherein:
   the control data is only adjusted during periods of non-use of the synthesized signal.

9. An apparatus for synthesizing sinusoidal radio frequency signals comprising:
   an oscillator configured to output a first sinusoidal signal having a first frequency;
   an impulse former configured to convert the first sinusoidal signal into a first pulse train having a first timing interval between pulses;
   a gearbox configured to dilate or compress the first timing interval between pulses of the first pulse train to thereby create a second pulse train having a second timing interval between pulses and a second frequency;

a recirculator configured to delay and add pulses in the second pulse train, to the second pulse train itself, to thereby form a third pulse train comprising pulses having a third timing interval between pulses and a third frequency, the third timing interval being less than the second timing interval; and circuitry to convert the third pulse train into an RF signal, which circuitry comprises:
  a divide-by-2-circuit configured to convert the third pulse train into square wave having a second frequency higher than the first frequency;
  a filter configured to remove harmonics from the square wave having the second frequency and thereby create a high frequency sinusoidal signal; and
  an amplifier configured to adjust a gain of the high frequency sinusoidal signal.

10. The apparatus according to claim 9, further comprising a first field-programmable gate array configured to:
provide first control signals to the gearbox;
provide second control signals to the recirculator;
provide third control signals to the oscillator to control a frequency of the oscillator; and
provide fourth control signals to control the filter.

* * * * *